(12) United States Patent
Buechner et al.

(10) Patent No.: US 7,124,379 B2
(45) Date of Patent: Oct. 17, 2006

(54) METHOD FOR COMMUNICATING A MEASURING POSITION OF A STRUCTURAL ELEMENT THAT IS TO BE FORMED ON A MASK

(75) Inventors: Bettine Buechner, Scheyern (DE); Christian Rotsch, München (DE); Henning Haffner, Dresden (DE)

(73) Assignee: Infineon Technologies AG, Munich (DE)

( * ) Notice: Subject to any disclaimer, the term of this patent is extended or adjusted under 35 U.S.C. 154(b) by 413 days.

(21) Appl. No.: 10/675,772

(22) Filed: Sep. 30, 2003

(65) Prior Publication Data
US 2004/0128643 A1 Jul. 1, 2004

(30) Foreign Application Priority Data
Sep. 30, 2002 (DE) .................. 102 45 621

(51) Int. Cl.
*G06F 17/50* (2006.01)
(52) U.S. Cl. .................. 716/4; 716/19; 716/20; 382/151; 700/121
(58) Field of Classification Search ........ None
See application file for complete search history.

(56) References Cited

U.S. PATENT DOCUMENTS

| | | | |
|---|---|---|---|
| 5,646,870 A * | 7/1997 | Krivokapic et al. ........ 716/4 |
| 5,933,350 A * | 8/1999 | Fujimoto et al. ......... 700/121 |
| 6,457,168 B1 | 9/2002 | Jakobs ..................... 716/19 |
| 6,549,648 B1 * | 4/2003 | Rinn ....................... 382/151 |
| 6,631,511 B1 * | 10/2003 | Haffner et al. ............. 716/21 |
| 6,704,920 B1 * | 3/2004 | Brill et al. ................. 716/19 |
| 6,711,453 B1 * | 3/2004 | Yamada et al. .......... 700/121 |
| 6,801,823 B1 * | 10/2004 | Mori ....................... 700/117 |
| 2002/0083408 A1 | 6/2002 | Haffner et al. ............. 716/19 |
| 2002/0165636 A1 * | 11/2002 | Hasan ..................... 700/121 |

FOREIGN PATENT DOCUMENTS

| | | |
|---|---|---|
| DE | 199 03 200 A1 | 8/2000 |
| DE | 100 44 257 A1 | 4/2002 |
| WO | WO 98/01903 | 1/1998 |

* cited by examiner

*Primary Examiner*—Leigh M. Garbowski
(74) *Attorney, Agent, or Firm*—Laurence A. Greenberg; Werner H. Stemer; Ralph E. Locher

(57) ABSTRACT

A measuring position for finding a structural element for measuring a characteristic dimension, for instance, the critical dimension CD, which element is about to be formed on a mask, is inserted as second data information into an exchange file containing the circuit layout in a hierarchical configuration of first data information or cells representing the structural elements. To prevent the second data information, which are virtual structural elements, from being incorporated in the control instructions for mask exposure, like the first data information, as structural elements that are to be formed, the second data information does not include an allocation of a geometric shape to the measuring position, or a shape that is allocated thereto has the transparency of the background, so that there is no contrast during the exposure. The second data information can be inserted as allocated to a plane that is not converted into a control instruction.

19 Claims, 4 Drawing Sheets

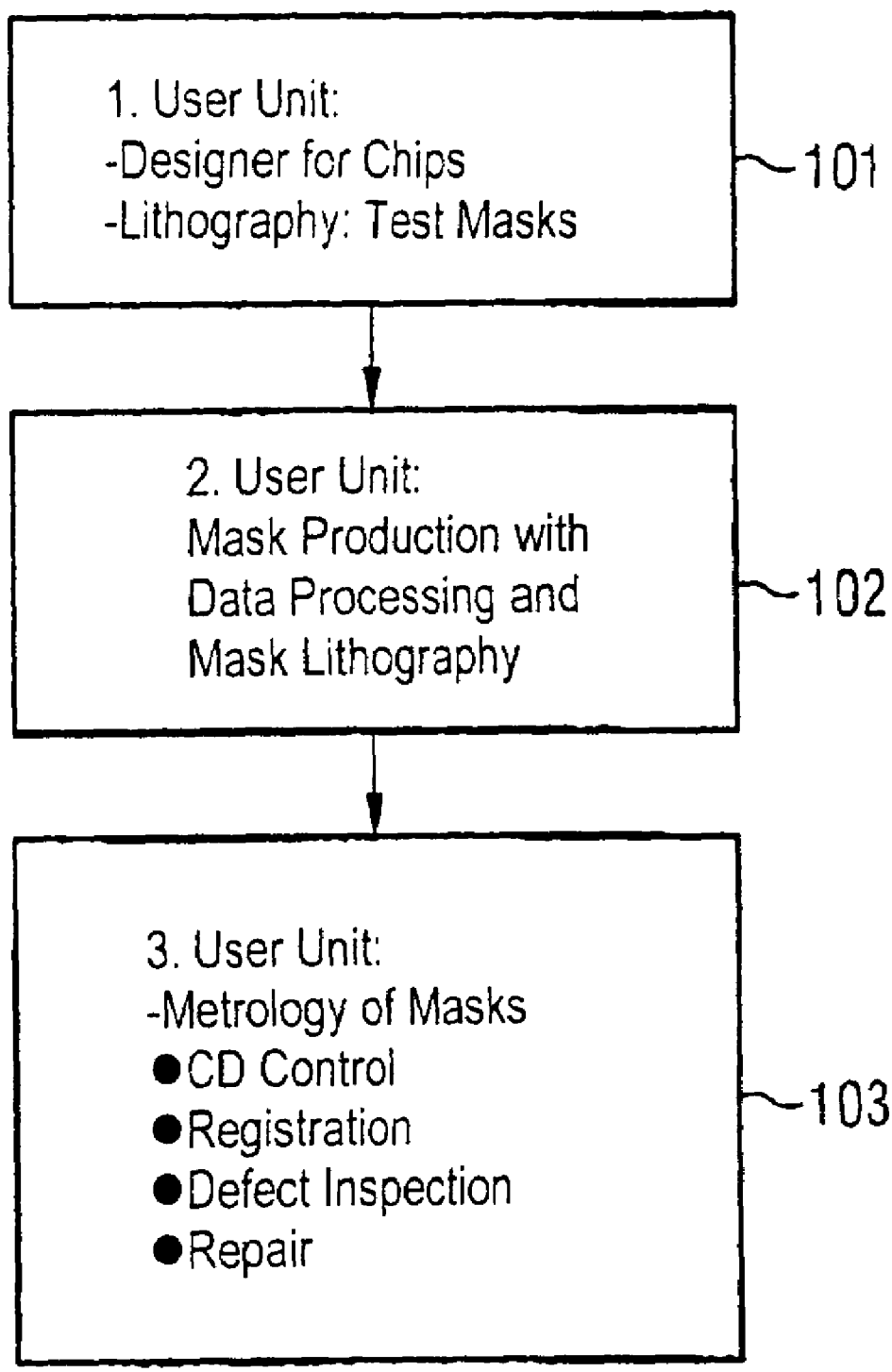

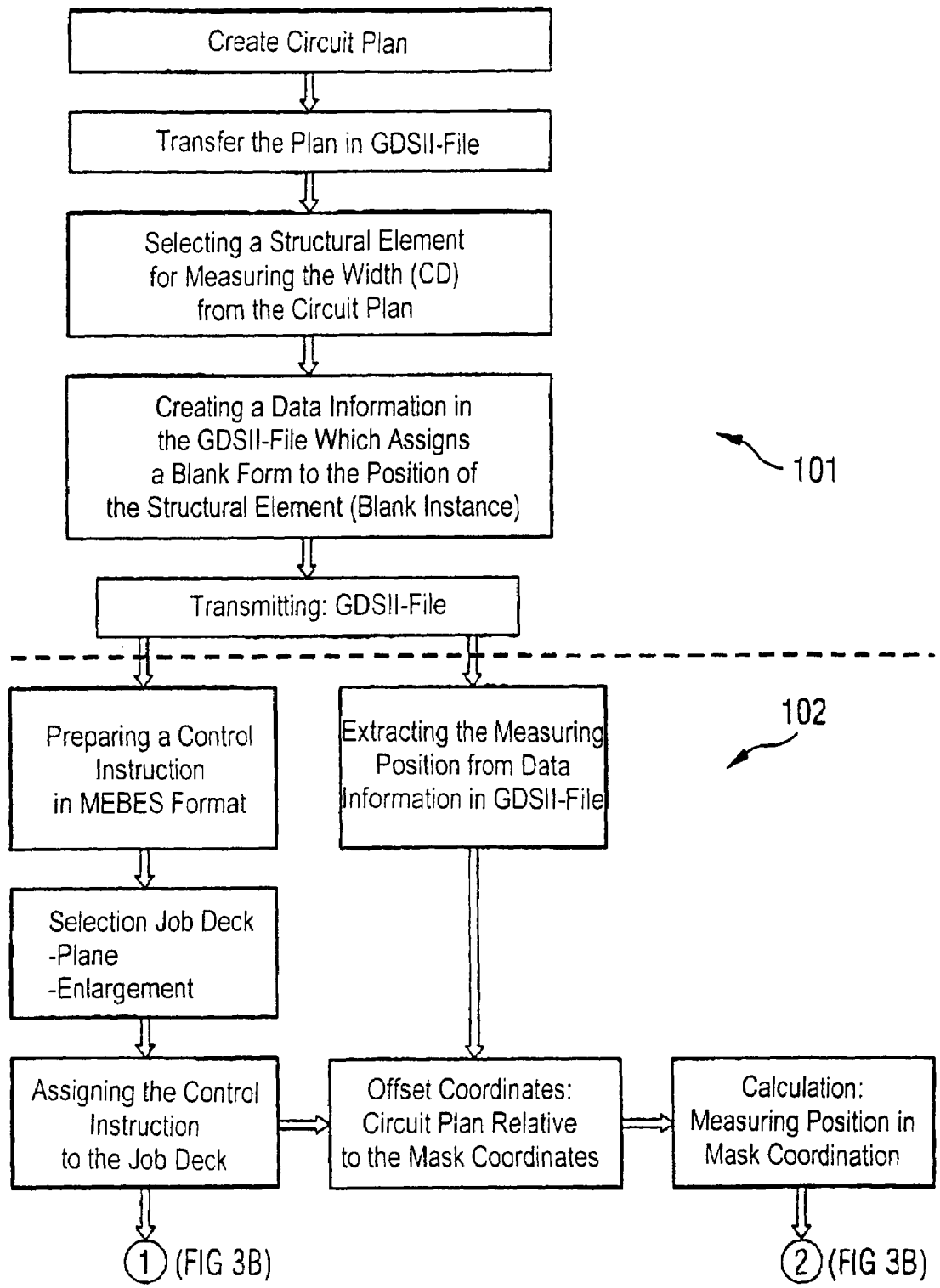

METHOD FOR COMMUNICATING A MEASURING POSITION OF A STRUCTURAL ELEMENT THAT IS TO BE FORMED ON A MASK

BACKGROUND OF THE INVENTION

Field of the Invention

The invention relates to a method for communicating at least one measuring position of a structural element for the measuring of a characteristic dimension, which element is about to be formed on a mask for lithographic projection.

The photolithographic structuring of semiconductor wafers for integrated circuit fabrication involves the utilization of masks, the structures disposed on the masks being projected onto the semiconductor wafer after it has been varnished with a photosensitive layer. As the integration density of structures in the circuits steadily increases, the widths of the structural elements that are to be formed on the masks, and the tolerances that must be maintained in connection with the elements, grow smaller. The positional accuracy requirements for structural elements on the mask rise accordingly.

Due to the higher standards and the increasing complexity of the specifications that must be maintained in mask fabrication, measuring technologies and strategies must be constantly updated. For example, today it is seldom enough to place a small number of defined measuring marks in the margin region of a circuit or in the frame between the circuits and to search and measure manually at the predetermined positions to check the adherence to prescribed specifications.

Rather, the number of objects requiring examination has increased substantially, on one hand, and, on the other hand, it is no longer dedicated measuring structures that must be measured, but, rather, the structural elements of the circuit itself.

The positional accuracy of structural elements that are disposed in a region of a first circuit plane having a particularly high coverage density may have to be measured based on a critical distance from another structural element of another circuit plane. However, due to the very fact that the coverage density is so high, it is impossible to measure the positional accuracy with the aid of additional measuring marks that would have to be disposed in the immediate vicinity. Furthermore, if there are a large number of similarly shaped structural elements, as in the case of memory modules, it would be difficult, if not impossible, for an operator of a measuring device to find precisely the sought structure for measuring purposes.

In the measuring of widths of the structural elements for purposes of checking the maintenance of tolerances, the widths that are measured in a scanning electron microscope are compared with the widths that are determined from the circuit plans. The circuit plans are created by the first user units in the mask fabrication process, which may be, among other units, designers. The circuit plans created by these user units include the layout in substantially exact form, which they need for the ultimate formation on the semiconductor wafer.

However, to be able to compensate systemic effects that influence the structure widths or shapes in the transfer of a structural element from a mask onto a wafer, the structural elements on the mask are, frequently, provided with biases and/or auxiliary structures (optical proximity correction, OPC). The structure widths, therefore, need not necessarily conform to the structural element widths actually formed on the masks.

The mask fabrication is considered the second user unit in the flow for producing a mask. It receives the wiring plans in the form of files in a standardized file exchange format. GDSII and CIF are known formats. Normally, in a process upstream from the mask fabrication, the wiring layout, which includes several planes, is partitioned by what is referred to as a fracturer from the file exchange format into the control files for the mask exposure devices, which files are needed for producing the mask planes. The above-mentioned biases and OPC corrections were already factored in at that point.

The mask fabricator, the second user unit, merges several identical or different control files of this type, which encompass the planes of the wiring plans, into what are referred to as job decks for the mask exposure.

As the third user unit in the production process, metrology is performed, including the measuring of the structural element. This carries out the required measurements for the purpose of guaranteeing the quality within prescribed tolerances at the desired measuring positions. A characteristic dimension of the structural element, such as the structure width or a position deviation relative to a prescribed value (registration), is measured. Particularly in cases where dedicated measuring structures are not provided, but, instead, structural elements of the circuit are being measured, the third user unit requires information as to the measuring positions at which structural elements must be examined.

The tolerances that must be maintained by the mask fabrication as well as the desired location of measuring positions on or next to the chip are usually prescribed by the customer, generally, the manufacturer of the wafer that will be exposed with the aid of the mask. But the first user unit, having only the circuit layout available to it, can define these measuring positions only in the coordinates of the reference system of just this one circuit. Hitherto such information was conveyed orally or by e-mail with the file in the standardized format of the second user unit.

Due to the merging of the individual coordinate systems of several circuit planes into a new coordinate system based on the mask, the second user unit had to recalculate the measuring positions. In that connection, a possible rotation of the individual wiring plans and a reflection about the y-axis had to be accounted for in the projection based on the configuration. But such a course of action is expensive and, more importantly, error prone, particularly when these recalculations are performed manually. In the past, given design changes, it could happen that coordinate systems of older design stages were retained and transferred, and false information was given about the structural elements that were to be measured.

Mis-transmission of a measuring position to the third user unit can give rise to inadvertent measuring of a similar but not identical circuit element on the mask. If slight but significant differences arise compared to the widths of the corresponding structural element from the wiring plans, they lead to an unnecessary loss of the appertaining mask. These differences can stem from the subsequently incorporated biases or OPC corrections.

Alternatively, the user units agree on what are referred to as zoom-ins, which provide for magnification at ever greater depths with the microscope starting from the global configuration of the structural elements with the aid of the positions of characteristic structural configurations on the mask, in order, ultimately, to find the structural element for measuring that has been stipulated by the two user units.

Besides the outlay required for the agreement among the parties for creating new zoom-ins for each layout, the magnification process itself takes up valuable device time.

SUMMARY OF THE INVENTION

It is accordingly an object of the invention to provide a method for communicating a measuring position of a structural element that is to be formed on a mask that overcomes the hereinafore-mentioned disadvantages of the heretofore-known devices and methods of this general type and that improves the quality of the measuring process and provides measures by which errors are prevented in the communication of measuring positions to a metrology user unit. Also, costs of the mask fabrication process are to be reduced.

With the foregoing and other objects in view, there is provided, in accordance with the invention, a method for transmitting at least one measuring position of a structural element for measuring a characteristic dimension in a microscope, which element is about to be formed on a mask for lithographic projection, includes the steps of:
  in a first user unit, defining a circuit layout including the structural element that is about to be formed;
  transferring the circuit layout into a file with a format in which the structural element that is to be formed is represented by first data information including an allocation of a position to a geometric shape and the at least one plane;
  generating second data information in the circuit layout that was transferred into the file;
  no geometric shape, or a shape with a second transparency that is different from the first transparency, being allocated to the measuring position therein;
  transmitting the circuit layout that was transferred into the file and that contains the second data information to a second user unit;
  in the second user unit, reading the measuring position of the second data information in the circuit layout that was transferred with the file;
  forming a control instruction for an exposure apparatus from the circuit layout;
  exposing the mask with the structure pattern; and
  transmitting the mask and the measuring position to a third user unit for finding the structural element on the mask at the measuring position in a measuring device and for measuring the characteristic dimension of the structural element.

With the objects of the invention in view, there is also provided a method for transmitting a circuit layout including at least one measuring position of a structural element for measuring a characteristic dimension in a microscope, which element is about to be formed on a mask for lithographic projection, including the steps of:
  in a first user unit, defining a circuit layout including at least a first plane with the structural element that is to be formed;
  transferring the circuit layout into a file with a format in which the structural element that is to be formed is represented by first data information including an allocation of a position to a shape with a content;
  the first data information being allocated to the at least one plane;
  generating a second plane, to which no further data information representing structural elements that are to be formed is allocated;
  generating second data information in the second plane including an allocation of a position to a geometric shape in the circuit layout that was transferred into the file;
  transmitting the circuit layout that was transferred into the file and that contains the second data information to a second user unit;
  in the second user unit, reading the measuring position of the second data information in the circuit layout that was transferred with the file;
  forming a control instruction for an exposure apparatus from the circuit layout;
  exposing the mask with the structure pattern; and
  transmitting the mask and the measuring position to a third user unit for finding the structural element on the mask at the measuring position in a measuring device and for measuring the characteristic dimension of the structural element.

According to the invention, a virtual structural element is added to the structural elements of the circuit layout that will be formed on a mask in an exchange file including the circuit layout, which virtual structural element has a position but, in the process flow for producing the mask, it does not lead to any mapping in the control instruction for a mask writer on which the mask exposure is based.

In accordance with another feature of the invention, the first and second data information are configured as cells in a hierarchical structure of cells, each of the cells including a separate coordinate system with an origin coordinate and each cell being linked with a cell respectively thereabove in the hierarchical structure by a position of a respective origin coordinate in the coordinate system of the higher-ranking cell.

The structural elements are represented by what are referred to as cells or instances, which are provided by various formats of standardized exchange files. Two-dimensional graphic design data, typically in binary form, are transferred among user units by such formats. The cells are data information that is formed in a hierarchical configuration of graphic structural elements. They can contain allocations of two-dimensional positions to geometric shapes and their contents, such as color values or transparencies (light transparencies in this case). Examples include polygons, text, boxes, fields, etc.

A cell, i.e., data information, includes a coordinate system whose origin having coordinate values in the coordinate system of a cell that is one rank higher in the hierarchy; i.e., it is placed only relative to that. If a cell is altered, all the cells under it in the hierarchy shift with it, without the coordinates of positions or the shapes having to be adapted.

The elements can, thus, be disposed in planes like the later structural pattern on the masks.

This is the case in the standardized file exchange format GDSII (Cadence Design Systems, Inc., San Jose, USA), for example. A standardized file exchange format exists when the two parties, the sender and receiver, have reached agreements about the format for storing data information.

In accordance with a further mode of the invention, in addition to the first data information of structural elements, which has been utilized in the prior art, second data information are generated inventively, which second data information represent only positions, measuring positions to be exact, instead of structural elements that are to be formed. The second data information is configured such that, during the process of forming a control instruction from the circuit layout, which is performed by the fracturer, the structural element represented by the second data information is not included in the control instruction; that is, it is not structured on the mask in the exposure step. A measuring position can be represented by the coordinate origin of a cell, for example.

In accordance with an added mode of the invention, a first transparency is additionally allocated to the first geometric shape of the first data information and a second transparency different from the first transparency is additionally allocated to the second geometric shape of the second data information.

Representation is accomplished by allocating the position that is defined in the second data information an empty shape or no shape at all. To allocate no shape, the relevant field in the exchange file is left blank. An empty shape is allocated to it by the selection of a shape, or of a transparency that is allocated to the position, which is identical to that of the structural background. For bright structural elements on a dark background, the transparency is opaque; for dark structural elements on a bright background, the transparency is transparent.

In accordance with an additional mode of the invention, a scanning electron microscope, an optical microscope for determining the width of a structural element, or an optical microscope for determining the positional accuracy of a structural element is utilized as the measuring device.

In accordance with yet another mode of the invention, the steps of the method are carried out for a number of structural elements with at least one measuring position, respectively.

In accordance with yet a further mode of the invention, the circuit is provided as a memory cell field.

In accordance with yet an added mode of the invention, a structural element located within approximately 10 μm of a margin of the memory cell field is allocated to one of the two items of data information of the measuring positions.

With the objects of the invention in view, there is also provided a method for transmitting at least one measuring position of a structural element for measuring a characteristic dimension, which element is about to be formed on a mask for lithographic projection, including the steps of defining, in a first user unit, a circuit layout with the structural element that is to be formed, transferring the circuit layout into a file with a format in which the structural element that is to be formed is represented by first data information including an allocation of a position to a geometric shape, generating second data information in the circuit layout transferred into the file, allocating a reference string or name to the measuring position in the second data information, transmitting to a second user unit the circuit layout transferred into the file and containing the second data information, reading, in the second user unit, the measuring position of the second data information in the circuit layout transmitted with the file with the aid of the reference string or name, forming a control instruction for an exposure apparatus from the circuit layout, exposing the mask with a structure pattern, and finding the structural element on the mask at the measuring position in a measuring device and measuring the characteristic dimension of the structural element by transmitting the mask and the measuring position to a third user unit.

With the objects of the invention in view, there is also provided a circuit layout for a circuit in a standardized file exchange format for transmission to a user unit for producing a mask and measuring a characteristic dimension of a structural element that is formed on the mask, including at least one exposure step-formed structural element to be formed on the mask, the structural element being represented in the exchange format by first data information including an allocation of a position to a shape with a content and a measuring position for finding the structural element in a measuring step with a measuring device, the measuring position being represented by second data information including an allocation of the measuring position to one of no geometric shape and a geometric shape having an empty content, the measuring position being represented by locating the second data information in a vicinity of the position of the first data information.

With the objects of the invention in view, in a user unit for producing a mask and measuring a characteristic dimension of a structural element that is formed on the mask with a measuring unit, there is also provided a circuit layout for a circuit in a standardized file exchange format for transmission to the user unit, the circuit layout including at least one exposure step-formed structural element to be formed on the mask, the structural element being represented in the exchange format by first data information including an allocation of a position to a shape with a content and a measuring position for finding the structural element in a measuring step with the measuring device, the measuring position being represented by second data information including an allocation of the measuring position to one of no geometric shape and a geometric shape having an empty content, the measuring position being represented by locating the second data information in a vicinity of the position of the first data information.

In accordance with still a further feature of the invention, the structural element is a plurality of structural elements to be formed, each of the structural elements is represented by the first data information, a measuring position represented by the second data information is respectively allocated to each of the structural elements, and the second data information forms a configuration with periodic intervals in the circuit layout.

According to a second embodiment of the invention, the second data information is placed in an additional plane that is added to the circuit layout. This plane is not subsequently utilized for forming structural elements on masks. The fracturer, thus, does not form control instructions for mask writers from the additional plane. The second data information represents a virtual structural element in the circuit layout, which element is not transferred to the mask even if it is also provided with a geometric shape and a transparency corresponding to the first data information. Like in the first development, the second data information serves as a carrier of measuring positions that can be read.

Special identifiers such as "XTARGET" can be designated in the file for program-controlled recognition of the second data information to make possible the advantage of automatic processing. It will, then, be possible for the first user unit (the designer), with the aid of the second data information, to define measuring positions in the circuit layout at will and convey them to the second user unit (the mask fabrication) along with the circuit layout in the standardized file exchange format.

In accordance with a concomitant feature of the invention, the measuring position is situating in a vicinity of the position of the first data information of the structural element that is to be formed on the mask.

The defined measuring positions are, advantageously, located substantially in the position or the vicinity of the critical structural element that is to be measured. The vicinity is outlined such that, by a search algorithm in a microscope, starting from the measuring position, the relevant structural element in the closest position, which is to be examined, can be unambiguously found.

The measuring positions can be read by the second user unit from the circuit layout in the hierarchical file exchange format with the aid of the identifier for the second data information. A particular advantage hereof is that these positions are necessarily given in the same hierarchy of coordinate systems as the structural elements that are represented by the first instances. This prevents uncertainty or error due to the separate transmission of coordinates in a coordinate system referencing an origin of the circuit layout or subordinate cells that may have changed in the meantime as a result of a design modification or a misunderstanding about the agreement, or some other reason.

Specifically, when the control instruction for the exposure device is assembled from the individual wiring plans that are to be exposed on the mask, the distance in the x and y directions of the origin coordinate of the circuit layout from the origin coordinate of the mask coordinate system is outputted so that, in consideration of this distance but without knowledge of the exact position of the origin coordinate in the circuit layout, the measuring positions that are read, i.e., their coordinates, can be converted into those of the mask coordinate system, it being possible to factor in the reflection and potential rotation that are performed by the mask fabrication itself. This advantage derives directly from the hierarchical configuration of the data information, i.e., the cells in the circuit layout.

The inventive second data information, i.e., instances or cells, thus makes possible an automatic processing for communicating the measuring positions to the third user unit, the metrology, though the virtual structural elements that are represented by the second data information are not formed as structures on the mask.

Other features that are considered as characteristic for the invention are set forth in the appended claims.

Although the invention is illustrated and described herein as embodied in a method for communicating a measuring position of a structural element that is to be formed on a mask, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

FIG. 1 is a flowchart with the user units that participate in mask fabrication according to the invention;

FIG. 3A is a first portion of a flowchart for communicating a measuring position for CD measuring in an SEM according to the invention.

DESCRIPTION OF THE PREFERRED EMBODIMENTS

Referring now to the figures of the drawings in detail and first, particularly to FIG. 1 thereof, there is shown a flowchart with the user units participating in the production of a mask as they are defined in the present document. These encompass the designer as creator of the circuit plans (first user unit 101), mask fabricators as producers of the masks from the circuit plans (second user unit 102), and quality control or metrology, which controls and inspects the finished (exposed and processed) masks (third user unit 103).

The inventive method for communicating one or more measuring positions is not limited to the purpose of the actual measuring in the context of quality control. Rather, measuring positions can also be transmitted to pre-set mask repair devices to these positions. Once the positions have been found and fine-tuned, a laser or FIB beam can be aimed to achieve the desired effect locally on the mask.

Figure 2A:
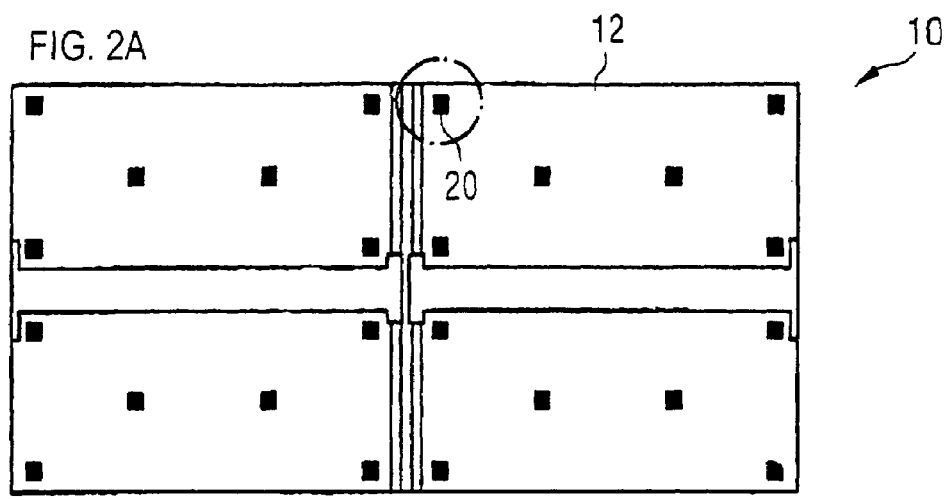
FIG. 2A is a fragmentary plan view of an exemplary embodiment of second data information ("empty instances") according to the invention in a circuit layout of a 256 Mb memory module.
Figure 2B:
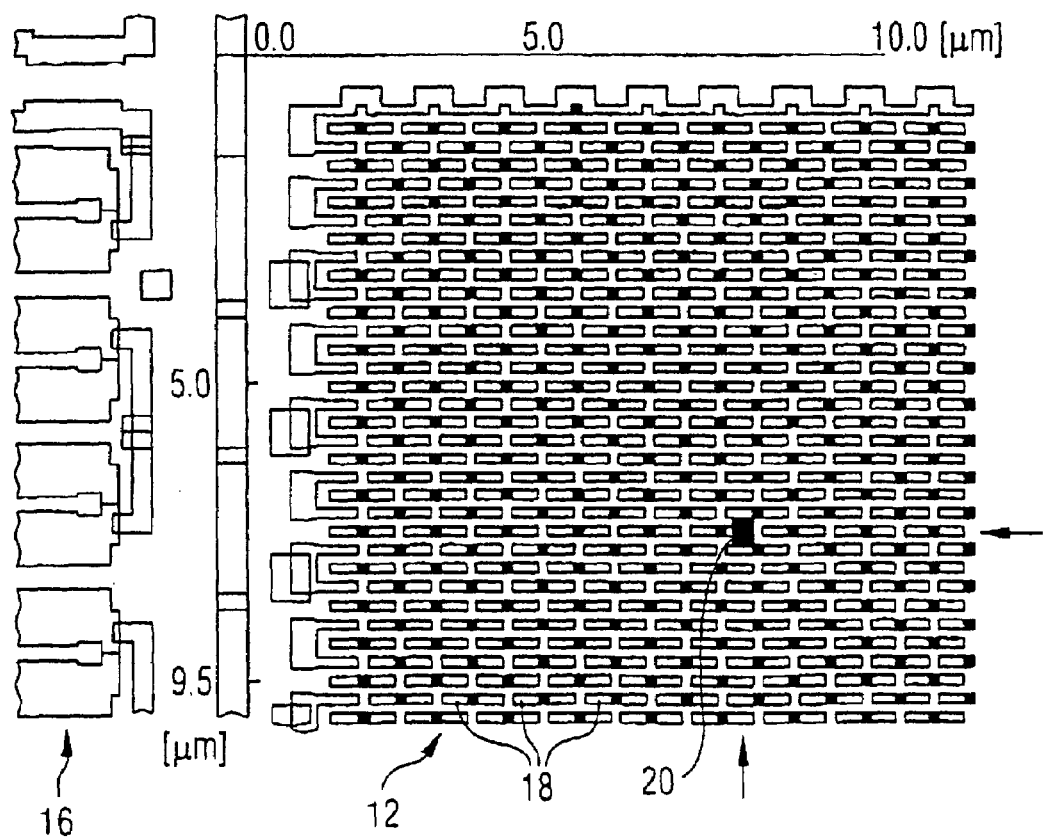
FIG. 2B is a fragmentary plan view of an enlarged detail of the second data information of FIG. 2A at a margin of a memory cell field.

FIGS. 2A and 2B represent an exemplifying embodiment of a circuit layout 10 that has been created by the first user unit. Represented in FIG. 2A is a 256 Mb memory chip (in 0.14 µm technology) with four memory cell fields 12 that are separated by what are referred to as splines, i.e., the control circuits in the periphery 16. As can be seen in the cutout at FIG. 2B, there are dense configurations of structural elements 18 in the memory cell field 12. Two planes are represented, one lying over the other: the definition of the active regions (active area, henceforth "AA plane") and, surrounding this, the flat isolating trenches (STI) and the bit line contacts.

In the circuit layout 10 of the memory cell field 12, six measuring positions 20 are represented respectively by second data information in an exchange file. The measuring positions 20 are typically stipulated to the designer, the first user unit, which places them in the exchange file, by an end customer, for instance, the manufacturer of the wafers that will be exposed with the aid of the masks. The GDSII format (Cadence Design Systems Inc., San Jose) is used in the example.

The circuit layout 10 has its own first coordinate system with an origin. In a cell or instance, the second coordinate system of the memory cell field 12, whose own origin includes a pair of coordinate values relative to the first reference system of the circuit layout 10, is placed in this first coordinate system. Placed in the second coordinate system, i.e., in the first cell that is ranked lower than the circuit layout, are, on one hand, allocations of coordinates to geometric shapes, which represent the structural elements 18 that will be formed on the mask as data information.

On the other hand, however, virtual structural elements that will not be formed on the mask are placed as second data information in the second coordinate system, i.e., the lower-ranking cell, as still lower-ranking cells. The origin of the respective third coordinate system is defined as measuring point 20. A geometric shape for the virtual structural element is not stipulated in the cell; that is to say, there is no allocation of a geometric shape to the measuring position 20, here the origin of the cell of the bottommost level of the hierarchy. The data information, or cells, are referenced by a name that can serve later for a selective selection of this information in a search function. The name "XTARGET" is utilized in the example.

For clarity of illustration, the elements 20 in FIGS. 2A and 2B that are identified by the data information are, nevertheless, represented with a small surface area.

As is represented in FIG. 2B in connection with the scale, some of the measuring positions 20 are placed within 10 µm of the margin of the memory cell field. This frequently causes particular problems in the lithography and subsequent processes, and, for that reason, the measuring of these positions is beneficial. In the present exemplifying embodiment, one of the active area structural elements is measured for width (critical dimension, CD) in a scanning electron microscope (SEM).

Figure 3B:
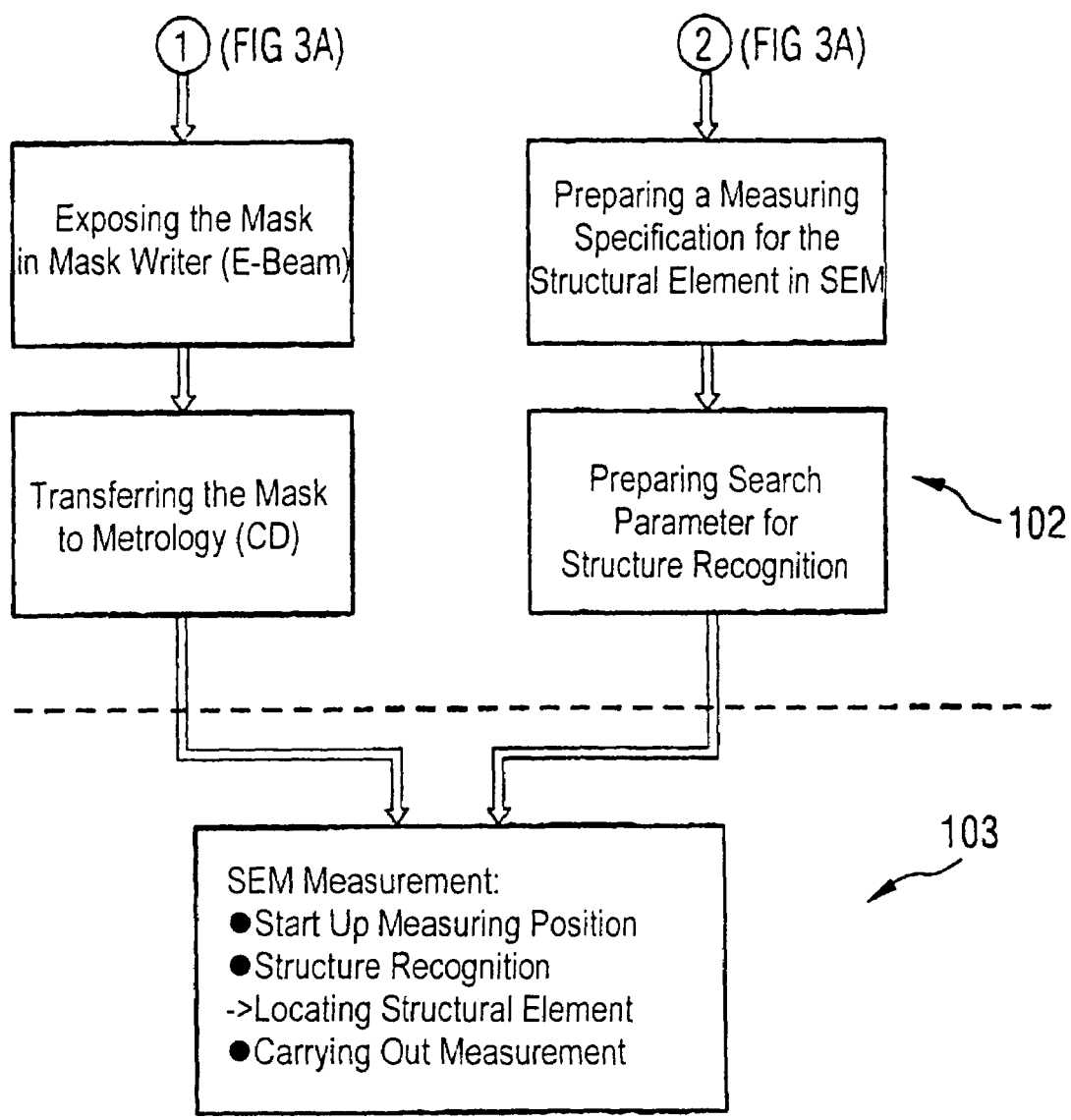
FIG. 3B is a second portion of the flowchart of FIG. 3A.

FIGS. 3A and 3B represent flowcharts of the sequence for producing and checking a mask for the present example.

Before the circuit layout is transferred in the above described exchange format that is deliverable to the mask fabricator 102, it must first be created by methods known to the average person skilled in the art. A series of known software programs is available for such a purpose. First, the plan is converted into the file with the hierarchical exchange format, the data information being placed therein as representations of the virtual structural elements at the measuring positions 20.

So modified, the exchange file is delivered to the mask fabrication 102 by electronic measures, for example. There, data preparation takes place. For each plane of the exchange file, a control instruction is created, for instance, in the MEBES format that is known in the prior art (what is referred to as "fracturing"), by which instruction the configuration of the structural elements 18 of the circuit layout 10 can be transferred onto the mask after it has been varnished with photosensitive resist. Biases are also factored in.

Several such control instructions of a plane are merged in a job deck in which the respective alignments, rotations, magnifications, reflections, and configurations relative to a mask coordinate system are performed.

In a parallel procedure, all data information from the received exchange file bearing the identifier "XTARGET" are selected by the second user unit 102. The origin coordinates are read and converted to the first coordinate system of the topmost level of the hierarchy for a calculation of the measuring positions 20.

The mask coordinate system has an origin. The above-mentioned mappings of the coordinate system of the circuit layout 10 onto the mask coordinates result in an offset of the origin coordinates. The coordinates of the measuring positions 20 are converted into the reference system of the mask in consideration of the mathematical representations like rotation, shift, reflection, magnification, and multiple placement of identical or different circuit plans.

The invention, thus, exploits the advantage that the absolute coordinates of an element can easily be recovered by the relative positioning of the coordinate systems in the coordinate system in the level above it in the hierarchy, respectively, even if geometric modifications have been made in the higher levels—here, the integration of the circuit layout into a mask coordinate system corresponding to a subsequently added hierarchical level. For example, version changes, shrinks, and corrections in the circuit may not be taken into account in the separate oral, electronic, or written communications of absolute coordinates, and consequently, errors can occur. Beyond the exchange file, are thus expediently reduced by the inventive method.

A measuring specification for the SEM is now created with the aid of the measuring positions that are given in the mask coordinates. Preparations therefor can be created by a suitable CAD software such as the program computer aided transcription system (CATS)—Transcription Enterprise, a Numerical Technology Inc. Company, San Jose. Here, search parameters like the size and shape of the structural element are set first, and, then, a search window size and the number of steps for a structure recognition (pattern recognition) by the SEM, or specifically its digital image processing unit, are set.

In a further step, the measuring positions 20 of the structural elements about to be examined are entered, to which the SEM must move. The measuring specification, having been stored and transferred into an SEM readable file, is, finally, delivered to the third user unit 103, the metrology.

In general, the first and second user units are logistically combined in one fabrication domain. But it is also possible for masks of another mask manufacturer to be shipped in for measuring purposes. In that case, the job of creating the measuring specification can be given to the third user unit also. The person skilled in the art is free to rearrange individual steps of the inventive method and to associate them to different user units as long as they possess the technical capabilities for carrying out the steps.

The SEM automatically moves to the measuring position 20, searches in the given search window for a nearby structural element that most closely matches the search parameters and performs the measurement.

We claim:

1. A method for transmitting at least one measuring position of a structural element for measuring a characteristic dimension in a microscope, which element is about to be formed on a mask for lithographic projection, which comprises:
    defining, in a first user unit, a circuit layout containing the structural element that is to be formed;
    transferring the circuit layout into a file with a format in which the structural element that is to be formed is represented by first data information including an allocation of a position to a geometric shape;
    generating second data information in the circuit layout transferred into the file;
    allocating a second geometric shape to the at least one measuring position in the second data information to prevent the second geometric shape from bringing about the formation of an exposed structure on the mask in the event of an exposure;
    transmitting to a second user unit the circuit layout transferred into the file and containing the second data information;
    reading, in the second user unit, the at least one measuring position of the second data information in the circuit layout transmitted with the file;
    forming a control instruction for an exposure apparatus from the circuit layout;
    exposing the mask with a structure pattern; and
    finding the structural element on the mask at the at least one measuring position in a measuring device and measuring the characteristic dimension of the structural element by transmitting the mask and the at least one measuring position to a third user unit.

2. The method according to claim 1, which further comprises:
    additionally allocating a first transparency to the first geometric shape of the first data information; and
    additionally allocating a second transparency different from the first transparency to the second geometric shape of the second data information.

3. The method according to claim 1, which further comprises situating the at least one measuring position in a vicinity of the position of the first data information of the structural element that is to be formed on the mask.

4. The method according to claim 1, which further comprises configuring the first and second data information as cells in a hierarchical structure of cells, each of the cells including a separate coordinate system with an origin coordinate and each cell being linked with a cell respectively thereabove in the hierarchical structure by a position of a respective origin coordinate in the coordinate system of the higher-ranking cell.

5. The method according to claim 4, which further comprises selecting GDSII as the standardized file exchange format.

6. The method according to claim 1, which further comprises utilizing, as the measuring device, one of the group consisting of a scanning electron microscope, an optical microscope for determining the width of a structural element, and an optical microscope for determining the positional accuracy of a structural element.

7. The method according to claim 1, which further comprises carrying out the steps of the method for a number of structural elements each having a respective at least one measuring position.

8. The method according to claim 7, which further comprises providing the circuit layout as a memory cell field.

9. The method according to claim 8, which further comprises allocating a structural element located within approximately 10 µm of a margin of the memory cell field to one of the two items of data information of the at least one measuring position.

10. A method for transmitting a circuit layout including at least one measuring position of a structural element for measuring a characteristic dimension, which element is about to be formed on a mask for lithographic projection, which comprises:
defining, in a first user unit, a circuit layout containing the structural element that is to be formed, the circuit layout including at least a first plane;
transferring the circuit layout into a file with a format in which the structural element that is to be formed is represented by first data information including an allocation of a position to a first geometric shape;
allocating the first data information to the at least first plane;
generating a second plane to which is allocated no further data information representing structural elements that are to be formed;
generating second data information in the second plane including an allocation of a position to a second geometric shape in the circuit layout transferred into the file;
transmitting to a second user unit the circuit layout transferred into the file and containing the second data information;
reading, in the second user unit, a measuring position of the second data information in the circuit layout transmitted with the file;
forming a control instruction for an exposure apparatus from the circuit layout;
exposing the mask with a structure pattern; and
finding the structural element on the mask at the measuring position in a measuring device and measuring the characteristic dimension of the structural element by transmitting the mask and the measuring position to a third user unit.

11. The method according to claim 10, which further comprises:
additionally allocating a first transparency to the first geometric shape of the first data information; and
additionally allocating a second transparency different from the first transparency to the second geometric shape of the second data information.

12. The method according to claim 10, which further comprises situating the measuring position in a vicinity of the position of the first data information of the structural element that is to be formed on the mask.

13. The method according to claim 10, which further comprises configuring the first and second data information as cells in a hierarchical structure of cells, each of the cells including a separate coordinate system with an origin coordinate and each cell being linked with a cell respectively thereabove in the hierarchical structure by a position of a respective origin coordinate in the coordinate system of the higher-ranking cell.

14. The method according to claim 13, which further comprises selecting GDSII as the standardized file exchange format.

15. The method according to claim 10, which further comprises utilizing, as the measuring device, one of the group consisting of a scanning electron microscope, an optical microscope for determining the width of a structural element, and an optical microscope for determining the positional accuracy of a structural element.

16. The method according to claim 10, which further comprises carrying out the steps of the method for a number of structural elements with at least one measuring position, respectively.

17. The method according to claim 16, which further comprises providing the circuit layout as a memory cell field.

18. The method according to claim 17, which further comprises allocating a structural element located within approximately 10 µm of a margin of the memory cell field to one of the two items of data information of the measuring position.

19. A method for transmitting at least one measuring position of a structural element for measuring a characteristic dimension, which element is about to be formed on a mask for lithographic projection, which comprises:
defining, in a first user unit, a circuit layout with the structural element that is to be formed;
transferring the circuit layout into a file with a format in which the structural element that is to be formed is represented by first data information including an allocation of a position to a geometric shape;
generating second data information in the circuit layout transferred into the file;
allocating a reference string or name to the at least one measuring position in the second data information;
transmitting to a second user unit the circuit layout transferred into the file and containing the second data information;
reading, in the second user unit, the at least one measuring position of the second data information in the circuit layout transmitted with the file with the aid of the reference string or name;
forming a control instruction for an exposure apparatus from the circuit layout;
exposing the mask with a structure pattern; and
finding the structural element on the mask at the at least one measuring position in a measuring device and measuring the characteristic dimension of the structural element by transmitting the mask and the at least one measuring position to a third user unit.

* * * * *